United States Patent [19]

Nakanishi et al.

[11] Patent Number: 5,144,258

[45] Date of Patent: Sep. 1, 1992

[54] POWER AMPLIFIER SYSTEM FOR RADIO TRANSMITTER AND METHOD FOR USING THE SAME

[75] Inventors: Eiichi Nakanishi; Tetsuo Onodera; Haruhiko Akiyama, all of Tokyo, Japan

[73] Assignee: Oki Electric Industry Co., Ltd., Tokyo, Japan

[21] Appl. No.: 729,601

[22] Filed: Jul. 15, 1991

[30] Foreign Application Priority Data

Jul. 19, 1990 [JP] Japan .................................. 2-189439

[51] Int. Cl.$^5$ ............................................. H03G 3/20
[52] U.S. Cl. .................................. 330/129; 330/136; 455/126
[58] Field of Search ............... 330/129, 131, 136, 149, 330/281; 332/103; 375/39, 60; 455/126

[56] References Cited

U.S. PATENT DOCUMENTS

4,574,248 3/1986 Snodgrass ..................... 330/136 X
4,592,073 5/1986 Watanabe ..................... 455/126 X Primary Examiner—Steven Mottola
Attorney, Agent, or Firm—Edward D. Manzo

[57] ABSTRACT

A power amplifier system suitable for a mobile radio receiver/transmitter is described. A wave form signal to be transmitted is made smooth during its rise and fall times, thereby making it possible to prevent a transmission spectrum from expanding and interfering with the adjacent channels. The power amplifier system compares an envelope signal of an inputted RF signal and that of an RF signal to be outputted, whereby the power amplifier system as a whole provides linear amplification.

8 Claims, 9 Drawing Sheets

Fig. 4(A) POWER OUTPUT
Fig. 4(B) STATE OF SWITCH 41
Fig. 4(C) STATE OF SWITCH 42
Fig. 4(D) STATE OF SWITCH 44
Fig. 4(E) OUTPUT OF THE BURST CONTROL CIRCUIT 40

POWER AMPLIFIER SYSTEM FOR RADIO TRANSMITTER AND METHOD FOR USING THE SAME

BACKGROUND OF THE INVENTION

1. Field of the Invention

This invention relates to a power amplifier system for a radio transmitter, and more specifically to a linear power amplifier system suitable for use in a mobile communication terminal. In particular, the present invention is concerned with a burst controller and a burst control method for the power amplifier system.

2. Description of the Related Art

QAM (Quadrature Amplitude Modulated) signals are now used for services such as mobile telephone systems. Elements which are important for the transmission of information by means of these QAM signals include not only their frequency but also their amplitude. Linear amplification is therefore essential upon power amplification of QAM signals.

For linear amplification of power, a linear amplifier such as a class-A amplifier can be used by way of example. It is however generally difficult to obtain good power efficiency by using a linear amplifier. Application of such a linear amplifier to a mobile radio receiver/transmitter which is primarily required to be driven by batteries is therefore disadvantageous.

Accordingly, a proposal has already been made on a circuit which makes use of a non-linear amplifier capable of providing a good power efficiency and, as an entire amplifier system, can realize linear amplification. Such a conventional circuit will hereinafter be described. The power amplifier system includes a saturated power amplifier which is a non-linear amplifier. This amplifier has a control terminal to which a control signal can be applied. The amplifier changes its output power in accordance with the voltage of the control signal. Since this amplifier is a saturated amplifier of the type that a non-linear relationship exists RF inputted signal to the amplifier and a RF signal to be outputted from the amplifier, an envelope feedback control is applied to the amplifier so that envelope signals of both a RF signal inputted into the amplifier and a RF signal to be outputted from the amplifier can be taken out. The envelope signal of the RF signal to be outputted can be linearly amplified relative to the envelope signal of the inputted RF signal.

Incidentally, the TDMA (Time Division Multiple Access) system is used for the digital mobile telephone system presently employed in North America. A radio transmitter is therefore required to transmit signals at a predetermined interval. Accordingly, ON-OFF control, namely, burst control is needed for the power amplifier system. Upon performing burst control, it is necessary to allow the power level to rise and fall as smoothly as possible. High frequency components are contained in abrupt rise and fall waveforms, so that the transmission spectrum expands at the moment of each rise or fall. This causes interference with the adjacent channels.

SUMMARY OF THE INVENTION

An object of the present invention is to provide a power amplifier system which is substantially free of expansion of its transmission spectrum.

Another object of the present invention is to provide a power amplifier system which can sufficiently reduce its output power to the carrier-off level while transmission is stopped.

A further object of the present invention is to provide a radio transmitter in which each signal has, at its rise and fall times, a waveform suited for burst control.

According to a first aspect of the present invention, an envelope signal of an inputted RF signal is fed by a burst controller to a comparator during rise and fall times of power to be transmitted.

According to a second aspect of the present invention, the envelope signal of the inputted RF signal is cut off by the burst controller to avoid its input to the comparator while transmission is stopped.

According to a third aspect of the present invention, amplitude variations of the RF signal inputted to the power amplifier system are minimized during rise and fall times of power to be transmitted.

According to a fourth aspect of the present invention, a variable attenuator and a waveform shaper are provided in combination as the burst controller.

DESCRIPTION OF THE PREFERRED EMBODIMENTS

The present invention will hereinafter be described with reference to the accompanying drawings. The description will be made of the following embodiments as applied to the digital cellular mobile telephone system employed in North America. It is however to be noted that the field of the present invention is not limited by the embodiments.

Figure 1:
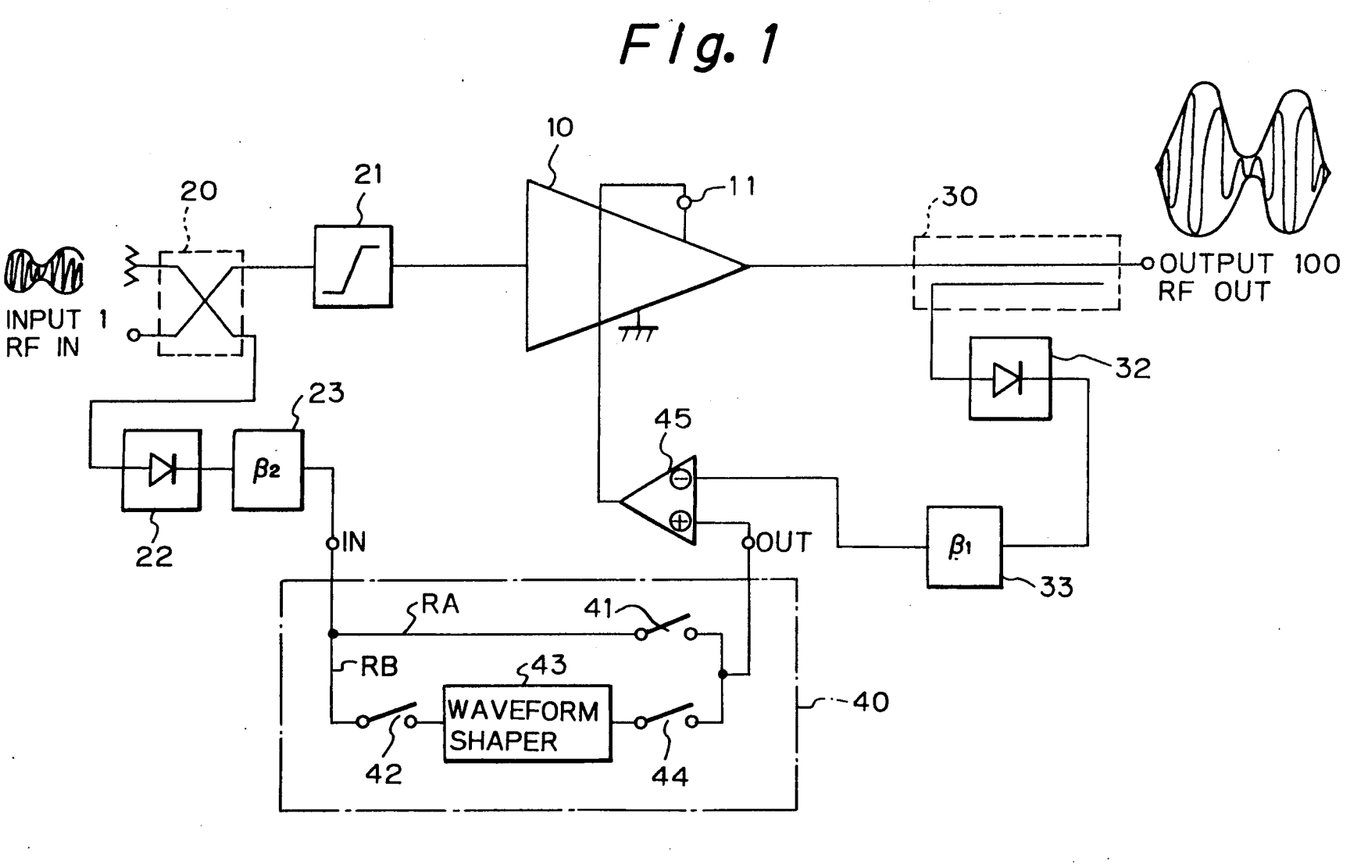
FIG. 1 is a block diagram of a power amplifier system according to a first embodiment of the present invention.

Referring first to FIG. 1, the power amplifier system according to the first embodiment of the present invention has a saturated power amplifier 10. This saturated power amplifier 10 amplifies a signal fed to an input terminal 1 and produces an output at an output terminal 100. The amplifier 10 has a control terminal 11 to which a burst control signal is applied. An input coupler 20 is arranged on an input side of the amplifier 10, while an output coupler 30 is disposed on an output side of the amplifier 10.

An RF input signal to the power amplifier system is inputted to the input coupler 20. The input coupler 20 divide the inputted RF signals into two signal portions. One of the signal portions is fed to a limiter 21, while the other signal portion is fed to an input detector 22. The limiter 21 limits the amplitude of the inputted RF signal portion and then feeds it to the amplifier 10.

The output coupler 30 takes out a portion of an output from the amplifier 10 and feeds it to an output detector 32. The output detector 32 detects the inputted RF output of the amplifier 10 to obtain an envelope signal of a RF signal to be outputted. This envelope signal is inputted to an amplifier 33 having an amplification factor $\beta 1$. The amplifier 33 amplifies the envelope signal inputted, and feeds the resulting signal to an inverted input terminal of a comparator 45.

In addition, the input-side detector 22 detects the inputted RF signal, whereby an envelope signal of the inputted RF signal is obtained. The input-side detector 22 sends the thus-obtained envelope signal of the inputted RF signal to an amplifier 23 having an amplification factor $\beta 2$. The amplifier 23 amplifies the envelope signal inputted, and feeds the resulting signal to a burst controller 40. The burst controller 40 feeds the amplified envelope signal to a noninverting input terminal of the comparator 45.

As a consequence, the comparator 45 determines the difference between the envelope signal RF signal to be outputted RF and the envelope signal of the inputted signal. This difference is then applied as a feedback control signal to a power control terminal 11.

The gains $\beta 1$ and $\beta 2$ should be determined in view of the amplification factor of the amplifier 10. The comparator 45 feeds the difference between the envelope signal of a output signal RFout and a reference signal obtained from the inputted signal RFin as a feedback signal to the control terminal 11, so that a feedback loop is formed. As a result of the feedback loop, the amplitude component of the inputted RF signal RFin is reproduced in the output signal RFout. In other words, linear amplification is realized.

If there is a sufficient loop gain in the frequency band of amplitude components of the QAM signal, the nonlinearity between the inputted RF signal to the amplifier 10 and the outputted RF signal from the amplifier 10 can be improved by the loop gain.

A QAM signal varies in amplitude over time. In general, a saturated power amplifier has been designed under the prerequisite that the level of power to be input remains constant. The limiter 21 is provided to limit the amplitude of the inputted QAM signal and to ensure stable operation of the amplifier 10. The limiter 21 is therefore not absolutely necessary provided that the amplifier 10 can stably operate even at low input level.

The burst controller 40 has two routes RA, RB for feeding the envelope signal of the inputted RF signal, the envelope signal having been fed from the amplifier 23, to a comparator 45. A first switch 41 is disposed in the route or conductive line RA. A second switch 42, a waveform shaper 43 and a third switch 44 are arranged in the route or line RB in the order as they are presented. These switches are operated by burst control signals which are fed from an unillustrated timing controller. These switches comprise an IC, such as a CMOS device.

Figure 2:
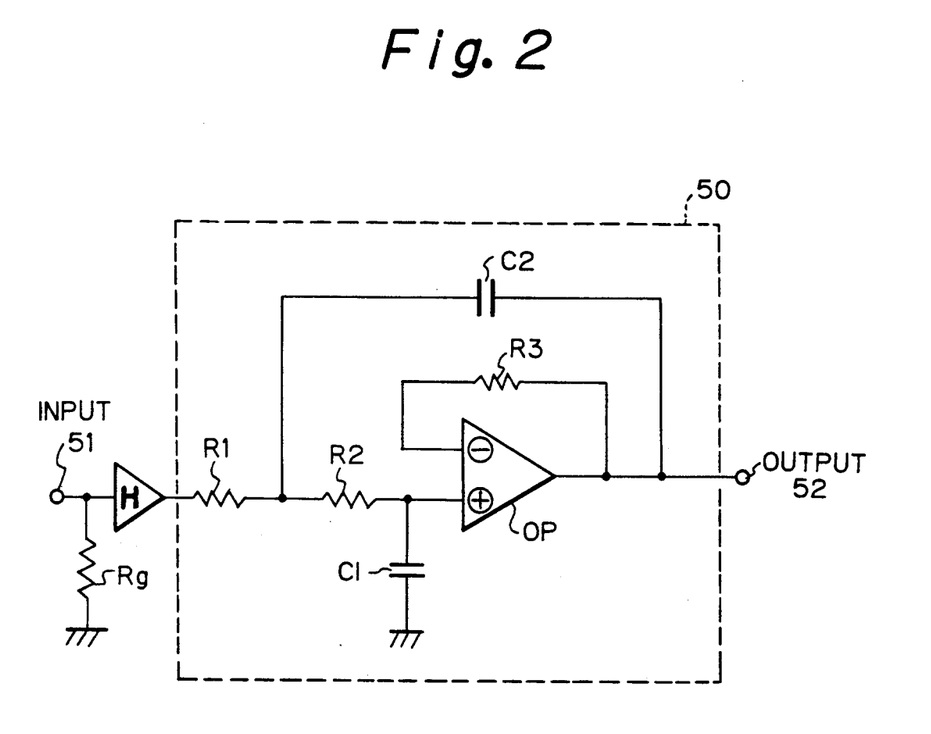
FIG. 2 is a block diagram of a waveform shaper.

The waveform shaper 43 is arranged to perform shaping of the waveform of a signal during a rise and a fall of the signal upon conducting burst control. The construction of the waveform shaper 43 is illustrated in FIG. 2. The waveform shaper 43 includes a secondary low-pass filter having two RC filters each of which is constructed of an active filter. In FIG. 2, a resistor Rg is a grounded resistor for setting the d.c. input level at 0 V. Each input signal is fed to an input terminal 51, and then to the low-pass filter 50 by way of a buffer amplifier H.

The low-pass filter 50 includes an operational amplifier OP. Between an output terminal of the buffer amplifier H and a non-inverting input terminal of the operational amplifier OP, resistors R1 and R2 are arranged in the order that they are presented. To the point of connection between the resistor R2 and the operational amplifier OP, a capacitor C1 is connected. The opposite terminal of the capacitor C1 is grounded. The capacitor C1 and the resistor R2 together form one of the RC filters.

A capacitor C2 is connected to the point of connection between the resistor R1 and the resistor R2. The opposite terminal of the capacitor C2 is connected to an output terminal of the operational amplifier OP. The capacitor C2 and the resistor R1 together form the other RC filter. The output terminal of the operational amplifier OP is also connected to a resistor R3. The opposite terminal of the resistor R3 is connected to an inverting input terminal of the operational amplifier OP.

An output from the operational amplifier OP appears at an output terminal 52 as an output of the low-pass filter 50. As is understood from the foregoing description, the waveform shaper is constructed by the secondary circuit. Use of such a secondary circuit makes it possible to set its output waveform as desired by changing the value of its quality factor Q. Moreover, much smoother waveform variations are obtained compared to a primary circuit which uses only one RC filter. Although the smoothness of the output waveform increases as the order of the circuit becomes higher, use of a tertiary or any higher circuit requires a complex construction. It is therefore not much more beneficial to use such a high-order circuit.

Burst control according to the present invention will hereinafter be described.

Figure 3A:
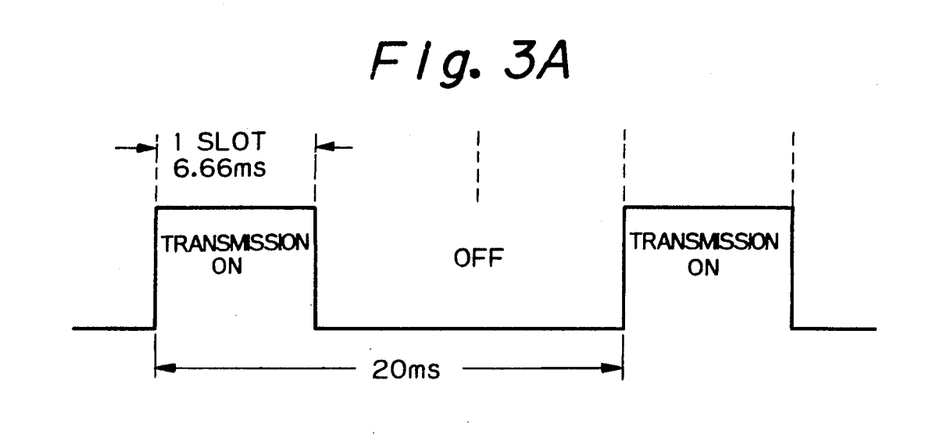
FIGS. 3(A) and 3(B) diagrammatically illustrate a transmission burst in detail.

FIG. 3(A) illustrates in detail a transmission burst specified in the North American digital cellular mobile telephone system. In North America, 3-channel TDMA system is used. When each cycle is, for example, 20 ms long, the transmission is performed as a burst signal for only 6.66 msec, as shown in the drawing.

Figure 3B:
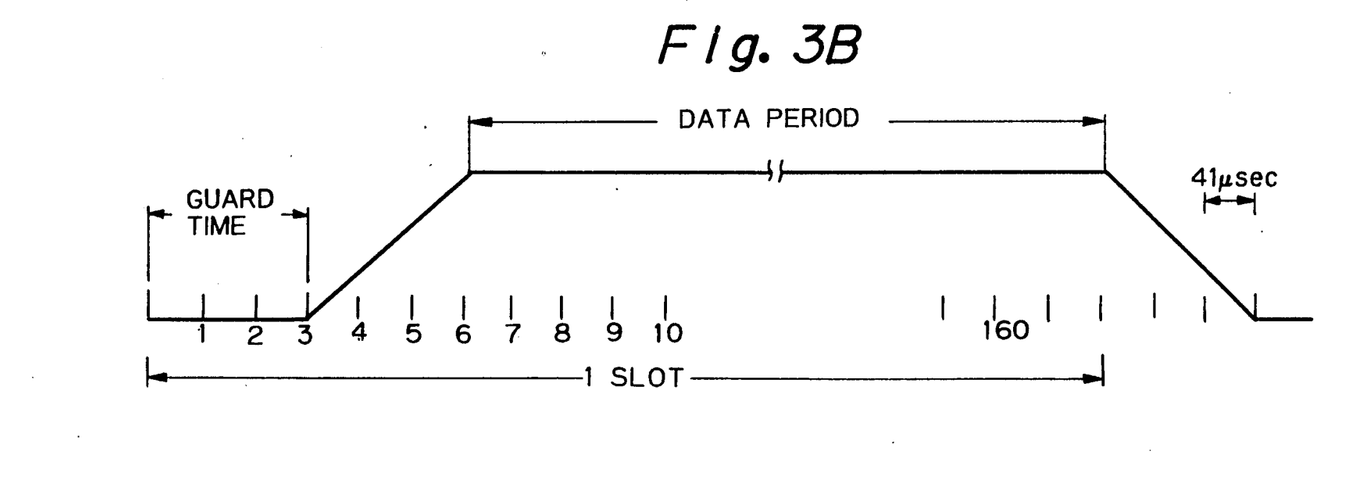

As is depicted in FIG. 3(B), each slot is divided into 162 symbol periods. Each symbol period is accordingly about 41 $\mu$sec. Of these symbol periods, the first three symbol periods are assigned as a guard time. During the next three symbol periods, an output to be transmitted is raised to a specified power level. Up to the subsequent 162th symbol period, transmission of data is performed. The power level is allowed to fall down to specified power level in the course of the three symbol periods which run after the end of the 162th symbol period.

Figure 4A:
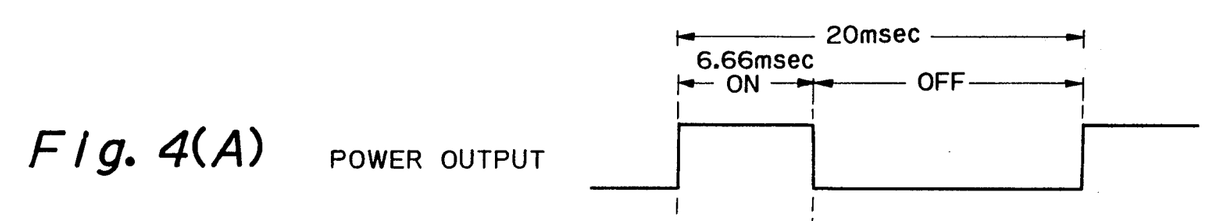
FIGS. 4(A), 4(B), 4(C), 4(D) and 4(E) are time charts showing the relationship between the operation of individual switches in the waveform shaper and outputted waveforms.
Figure 4B:
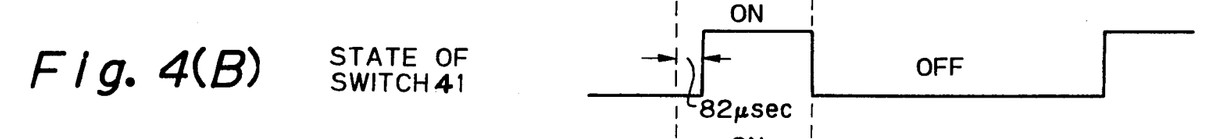
Figure 4C:
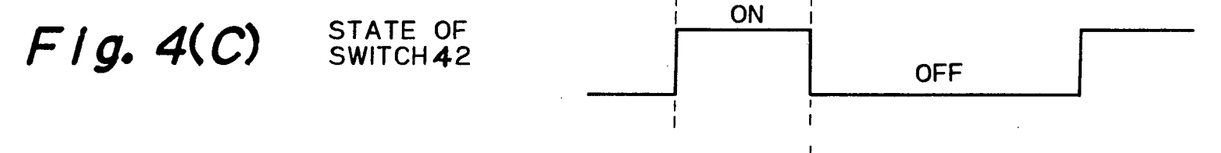
Figure 4D:
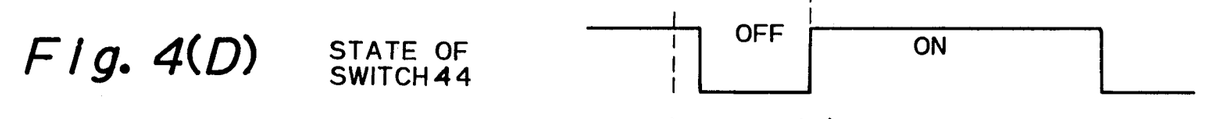

Referring next to the time chart of FIGS. 4(A) through 4(E), FIG. 4(A) indicates the ON-OFF timing of power output. FIGS. 4(B)–4(D) illustrate the operation of the respective switches. In these drawings, "ON" indicates that the switch is "closed" whereas "OFF" means indicates that the switch is "open". Further, the switching transition time of each switch is assumed to be sufficiently short.

1. Period T1 (before $t_0$)

During this period, the switch 44 alone is closed while the switches 41, 42 are maintained open. The output put of the burst controller 40 remains at 0 V (ground level) irrespective of the presence or absence of an input signal. The linearization loop therefore operates at 0 V as the reference voltage, so that the output power is 0 V. It is a prerequisite that the output PO is minimized when the controlling voltage is at 0 V. The output power therefore remains at 0 even when a carrier signal leaks and is inputted to the power amplifier system, thereby sufficiently realizing the carrier-off level.

2. Period $T_2$ ($t_0$ to $t_1$)

Figure 4E:
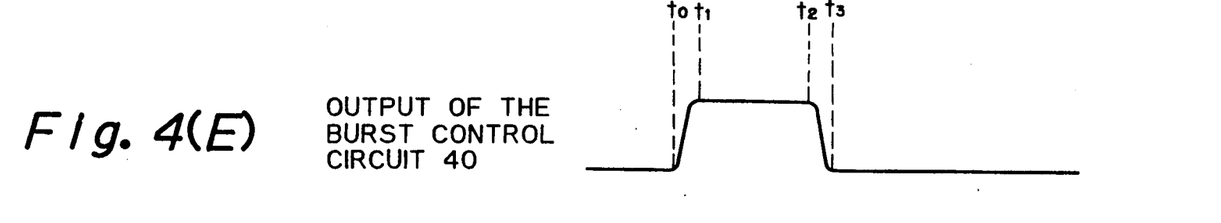

In this period, the switch 42 is also turned on in addition to the switch 44. An envelope signal obtained from an inputted RF signal is outputted via the line RB. Since the system has already moved to a transmitting operation before this period, the inputted signal rises from 0 V. The inputted signal is inputted to the waveform shaper 43 and is then shaped by the secondary RC filters. As is shown in FIG. 4(E), a signal outputted from the burst controller 40 smoothly rises toward an average value (integrated value) of the envelope signal of the inputted signal. An output from the burst controller 40 is a reference voltage for the comparator 45 so that power outputted from the amplifier 10 also rises smoothly.

3. Period $T_3$ ($t_1$ to $t_2$)

In this period, the switches 41, 42 are maintained "ON" while the switch 44 is kept "OFF". Namely, the envelope signal of the inputted signal travels through the route RA and becomes an output of the burst controller 40. During this period, the inputted signal has fully arisen and the envelope signal of the inputted signal is fed as a reference signal to the comparator 45. Therefore, linear amplification is performed in accordance with a conventional loop operation.

The output of the waveform shaper 43 is not fed to the comparator 45 as the switch 44 has already been turned off. The switch 42 is however closed so that the envelope signal of the inputted RF signal is inputted to the waveform shaper 43. This is to achieve smooth waveform variations in a fall time to be described subsequently.

4. Period $T_4$ ($t_2$ to $t_3$)

In this period, the switches 41, 42 are maintained "OFF" while the switch 44 is kept "ON". Accordingly, each output of the waveform shaper 43 becomes an output of the burst controller during this period. The envelope signal of the inputted signal is not inputted to the waveform shaper 43 during this period. However, in accordance with the time constant of the waveform shaper 43, the output of the burst controller smoothly falls down to 0 V from the average level of the envelope signal at the time that the waveform shaper 43 was operating normally.

5. Period $T_5$ (after $t_3$)

In this period, the switch 44 alone is turned on. Namely, the operation is as in the period T1 described above. Accordingly, the reference voltage of the linearization loop is 0 V while the output voltage of the amplifier 10 is 0 V.

By the foregoing timing control, the waveform of an input to the comparator 45 can be changed to a smooth waveform by intermittent actuation of the waveform shaper 43 during its rise and fall periods only. Incidentally, it is desired to set sufficiently wide the loop bandwidth of the feedback loop. By doing so, the loop operation can sufficiently follow the output of the waveform shaper 43.

In the case of the North American digital cellular mobile telephone system, 3 symbol periods (about 41 $\mu$sec per symbol period) are assigned for each of a rise and a fall as described above. Taking a settling time into consideration, the rise time is set for 2 symbol periods, namely, about 82 $\mu$sec. When the quality factor Q of the waveform shaper is set at a value capable of minimizing an overshoot during a rise to form an adequate rise, for example, at 0.7, the values of the individual elements of the waveform shaper 43 can be set as follows: R1=R2=1 k$\Omega$, C1=0.038 $\mu$F, C2=0.019 $\mu$F, R3=10 k$\Omega$, and Rg=10 k$\Omega$.

According to the present invention, the burst controller 40 having the waveform shaper 43 is provided so that an envelope signal of an inputted RF signal can be fed to the comparator via the waveform shaper during each of a rise time and a fall time of burst transmission. At this time, the burst controller is provided outside the feedback loop. Therefore, the feedback loop is always allowed to operate stably. Since the secondary RC circuit is used in the waveform shaper, a sufficiently smooth output waveform can be obtained with the simple construction. The burst controller feeds an output of 0 voltage level to the comparator while transmission is stopped. Even if a carrier is leaked, the power amplifier system can therefore control the to the carrier-off level without failure.

Burst control by the burst controller has been described. In the case of the North American digital cellular mobile telephone system, the following control in addition to the burst control makes it possible to obtain still smoother rising and falling waveforms. Namely, a carrier is modulated by the $\pi$/4DQPSK (Differential Quadrature Phase Shift Keying) method in the digital cellular mobile telephone system. Upon linear amplification of this signal, still smoother transitional response characteristics can be obtained at the time of burst transmission by controlling data to be transmitted during the three symbol periods of each of the rise and fall.

Figure 5:
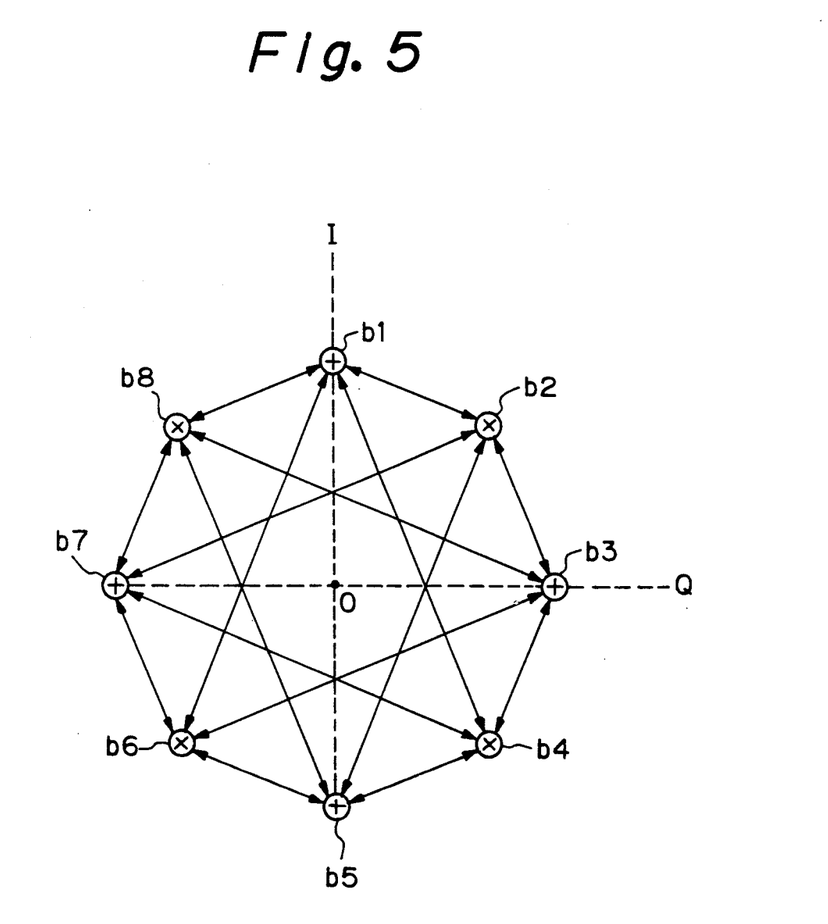
FIG. 5 is a space phase shift diagram of a $\pi/4$DQPSK-modulated wave.

Referring next to the modulation scheme using the constellation diagram of $\pi$/4DQPSK-modulation wave shown in FIG. 5, I signal components inputted to a quadrature modulator are plotted along an axis of ordinates whereas Q signal components are plotted an axis of abscissas. An audio signal inputted is converted to a digital signal. The digital signal is then subjected to a bit-by-bit mapping process as prescribed, so that the digital signal is converted to an I signal component and a Q signal component. Each signal can take one of the values of $\pm 1$, 0 and $\pm 2^{-\frac{1}{2}}$. Of these, the combination of the eight positions having the same amplitude, in other words, the combination of the eight positions having the same distance from an origin O are chosen as phase points to which the signal can shift. In the drawing, these phase points are indicated by b1 to b8. Here, the radius of the modulation scheme indicates the amplitude. Further, the $\pi$/4DQPSK-modulated wave is known to shift from a given phase point to either one of four phase points angularly spaced over $\pm 45°$ or $\pm 135°$ from the given phase point. For example, from the point b1, the wave shifts either one of the points b2, b4, b6 and b8.

Figure 6A:
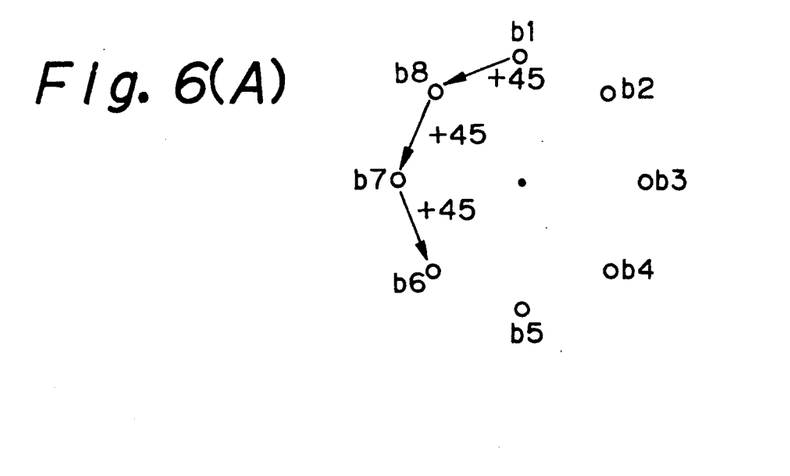
FIGS. 6(A), 6(B) and 6(C) diagrammatically depict the relationship between phase shifts and modulated waves.
Figure 6B:
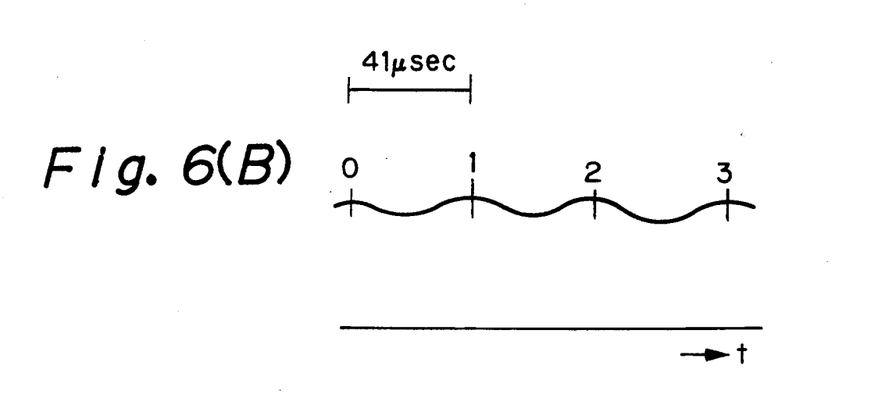
Figure 6C:
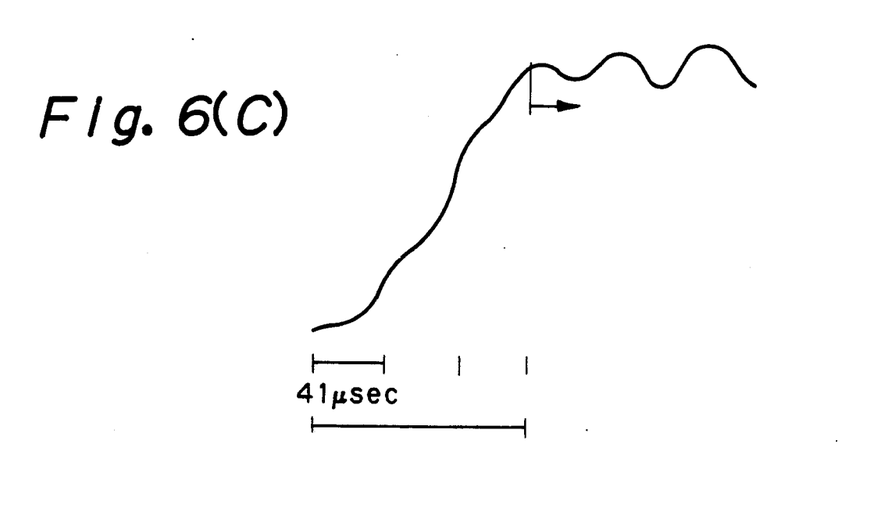

One example in which the phase shift is 45° is illustrated in FIGS. 6(A) through 6(C). In this case, the phase is shifted at substantially the same distance from the origin O as shown in FIG. 6(A). Accordingly, the amplitude envelope varies little during the continuous transmission as depicted in FIG. 6(B). When this 45° phase shift is applied to the rise time, the amplitude also varies little as illustrated in FIG. 6(C). When this modulated wave is caused to pass through the waveform shaper, it is therefore possible to obtain a very smooth output having a narrow band and a small frequency deviation.

Figure 7A:
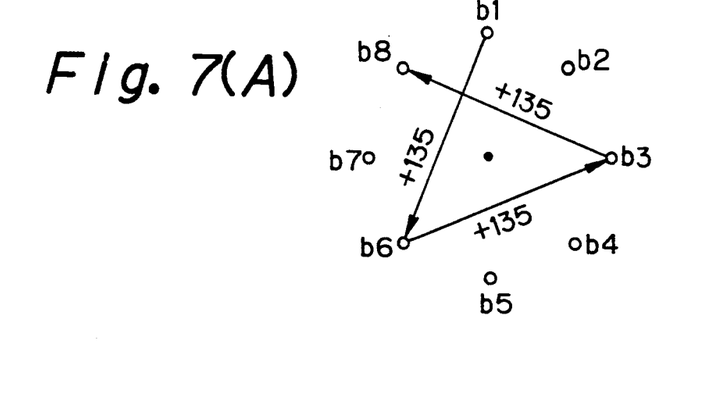
FIGS. 7(A), 7(B) and 7(C) diagrammatically illustrate the relationship between phase shifts and modulated waves.
Figure 7B:
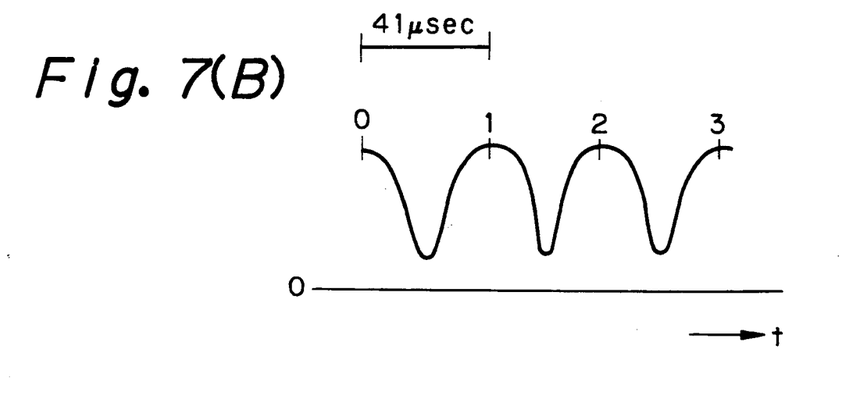
Figure 7C:
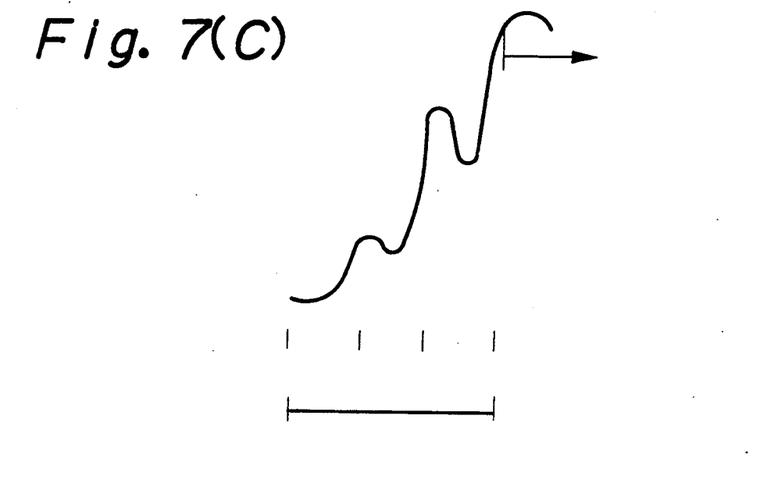

Another example in which the phase shift is 135° is depicted in FIGS. 7(A) through 7(C). In this case, the modulated wave passes near the origin O and shifts to the next phase point as shown in FIG. 7(A). Accordingly, the amplitude envelope also varies substantially during the continuous transmission as depicted in FIG. 7(B). When this 135° phase shift is applied to the rise time, the amplitude envelope also varies considerably as illustrated in FIG. 7(C). Even when this modulated wave is caused to pass through the waveform shaper, it is therefore difficult to absorb all the variations, leading to the potential problem that a frequency deviation may take place.

Such a relationship between phase shifting and amplitude variations is similarly observed during the fall time. According to the present invention, a modulated wave is therefore subjected to a phase shift at $+45°$ (or $-45°$) during its rise time and at $-45°$ (or $+45°$) during its fall time. As has been described above, still smoother transition characteristics can be obtained when data of a QAM signal to be fed to an amplifier during each of its rise time and its fall time are chosen in such a manner that amplitude variations of the QAM signal can be minimized.

Figure 8:
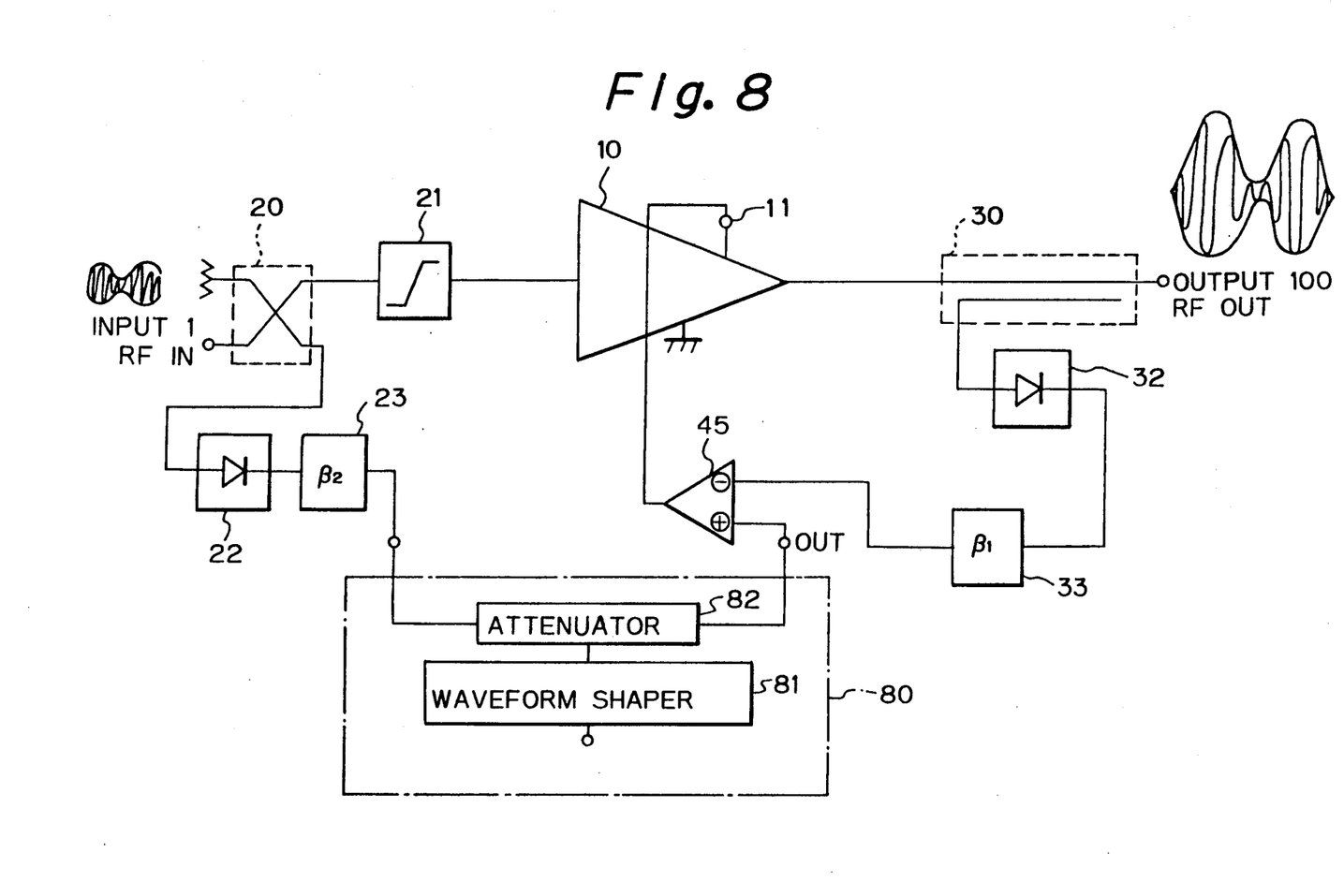
FIG. 8 is a block diagram of a power amplifier system according to a second embodiment of the present invention.
Figure 9:
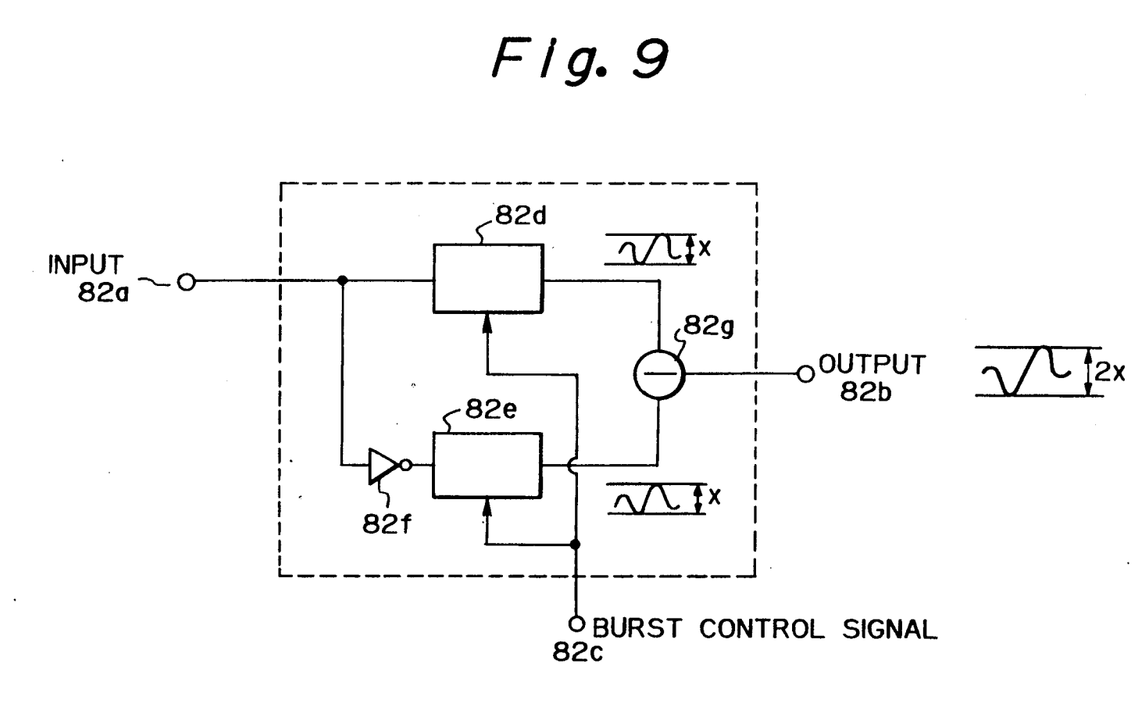
FIG. 9 is a block diagram of one example of an attenuator useful in another burst controller.

Referring next to FIGS. 8 and 9, the power amplifier system according to the second embodiment of the present invention will be described. A burst controller 80 is provided in place of the burst controller 40 depicted in FIG. 1. The burst controller 80 includes a waveform shaper 81 and an attenuator 82.

The construction and operation of the attenuator 82 will first be described with reference to FIG. 9. The attenuator 82 has a terminal 82a to which each input signal is fed, a terminal 82b where each output signal appears, and a control terminal 82c to which a burst control signal is applied. The attenuator 82 also includes a pair of variable attenuator elements 82d, 82e, an inverter 82f and a subtractor 82g. The variable attenuator elements 82d, 82e are each of the type that the degree of attenuation between an input to the attenuator element and a corresponding output from the attenuator element varies depending on the level of the burst control signal.

The paired variable attenuator elements 82d, 82e are provided with respective control terminals. The burst control signal fed to the control terminal 82c is applied to these control terminals. A base-band signal applied to the terminal 82a is inputted to the variable attenuator element 82d and the inverter 82f. Base-band signal is inverted by the inverter 82f and then inputted to the variable attenuator element 82e. Outputs from the paired variable attenuator elements 82d, 82e are inputted to the subtractor 82g. The subtractor 82g performs subtraction on the signals which are inputted, whereby a signal is outputted. Here, it is to be noted that the signal inputted to the variable attenuator element 82e has been inverted by the inverter 82f. As the output of the subtractor 82g, a signal twice as large as the output from one of the variable attenuator elements is produced.

In the case of a variable attenuator element of such a construction that the degree of attenuation is changed by using a control signal, the control signal is generally superimposed on a signal to be outputted in many instances. In other words, the signal to be outputted tends to be affected by the control signal.

According to the construction described above, the control signal is however canceled out by the subtractor 82g. The influence of the control signal therefore does not appear at the output terminal 82b. In addition, the waveform shaper 81 is inserted to avoid any spectrum expansion upon burst transmission (see FIG. 8).

A burst control signal is applied from to the burst controller 80 an unillustrated timing controller. This burst control signal is inputted to the waveform shaper 81. The waveform shaper 81 is constructed of such a secondary active filter as shown in FIG. 2. The burst control signal is therefore subjected to waveform shaping by the waveform shaper 81. For the same reasons as described above with reference to FIG. 2, such a secondary circuit is used as the waveform shaper 81. Accordingly, the power amplifier system according to the second embodiment can also provide a smooth output waveform as an output of the burst controller 80. As a consequence, the waveform to be transmitted from the power amplifier system can be smoothed during both its rise and fall times.

According to the second embodiment of the present invention, the effect of a control signal can be eliminated from an output signal by the attenuator. The power amplifier system of the second embodiment is therefore free of the potential problem of the development of a discontinuity in envelope which may in turn cause a spectrum expansion.

Needless to say, the power amplifier system of the second embodiment also provides a smooth burst waveform as a result of the waveform shaper. This is also effective in preventing expansion of a transmission spectrum, thereby making it possible to avoid interference with the adjacent channels. For the second embodiment of the present invention, it is also effective to choose data during both rise and fall times of a transmission output so that amplitude variations of the QAM signal can be minimized.

The embodiments of the present invention as applied to the North American digital cellular mobile telephone system have been described above. It is however to be noted that the present invention is not limited to mobile telephone systems. Namely, the present invention can be widely applied to various types of power amplifier systems. Further, QAM signals to be amplified are not limited to $\pi/4$DQPSK signals. The present invention can also be applied to other types of QAM signals provided that data during rise and fall times are chosen to minimize amplitude variations by phase shifting. Further, selection of data during rise and fall times of a QAM signal is effective irrespective of whether the power amplifier system is equipped with change-over switches or not.

What is claimed is:

1. A power amplifier system comprising:
a non-linear power amplifier for amplifying an inputted RF signal, said non-linear power amplifier having a control terminal;
a means for obtaining an envelope signal of the inputted RF signal;

a means for obtaining an envelope signal of the outputted RF signal;

a means for receiving the envelope signal of the inputted RF signal and that of the outputted RF signal, obtaining a feedback voltage from the difference between the inputted envelope signal and the outputted envelope signal, and applying the feedback voltage to the control terminal; and a burst control means interposed between the means for obtaining the envelope signal of the inputted RF signal and the means for obtaining the feedback voltage.

2. The system of claim 1 wherein the burst control means comprises:

an input terminal to which the envelope signal of the inputted RF signal is inputted, first and second conductive lines, both connected to the input terminal, an output terminal connected to the first and second conductive lines, a first switch means disposed in the first conductive lines;

second and third switch means disposed in the second line, a waveform shaper arranged between the second switch means and the third switch means said waveform shaper being adapted to smooth the inputted envelope signal of the inputted signal; and the burst control outputs the inputted envelope signal of the inputted RF signal through the waveform shaper during a transition period of burst transmission.

3. The system of claim 1 wherein the burst control means comprises:

an input terminal to which the envelope signal of the inputted RF signal is inputted;

an attenuator connected to the input terminal; and a waveform shaper connected to the attenuator to generate a burst control signal subsequent to waveform shaping.

4. A burst control method for a power amplifier system adapted to perform linear amplification of an inputted signal, said power amplifier system subjecting an envelope signal of the inputted signal to waveform shaping to provide a reference voltage for the power amplifier system, which method comprises:

controlling the reference voltage at ZERO V during a waiting period;

subjecting the envelope signal of the inputted RF signal to waveform shaping to provide the reference voltage during a rise time of a signal to be transmitted;

using the envelope signal of the inputted RF signal directly as the reference voltage during normal transmission; and using as the reference voltage an output of the power amplifier system during a fall time of the signal to be transmitted, said output being obtained from the inputted signal in accordance with a time constant of the power amplifier system.

5. The method of claim 4, wherein data to be transmitted are subjected to phase shifting at a phase change of $+45°$ or $-45°$ during the rise time of the signal to be transmitted and the fall time of the signal to be transmitted.

6. A power amplifier system comprising:

a non-linear power amplifier for amplifying an inputted RF signal, said non-linear power amplifier having a control terminal;

a circuit for obtaining an envelope signal of the inputted RF signal;

a circuit for obtaining an envelope signal of the outputted RF signal;

a circuit for receiving the envelope signal of the inputted RF signal and that of the outputted RF signal, obtaining a feedback voltage from the difference between the inputted envelope signal and the outputted envelope signal and applying the feedback voltage to the control terminal; and a burst control circuit interposed between the means for obtaining the envelope signal of the inputted RF signal and the means for obtaining the feedback voltage.

7. The system of claim 6 wherein the burst control circuit comprises:

an input terminal to which the envelope signal of the inputted RF signal is inputted;

first and second conductive lines, both connected to the input terminal;

an output terminal connected to the first and second conductive lines;

a first switch circuit disposed in the first conductive line;

second and third switch circuits disposed in the second conductive line;

a waveform shaper arranged between said second switch circuit and said third switch circuit, said waveform shaper being effective to smooth the inputted envelope signal of the inputted signal; and wherein the burst control is effective to the inputted envelope signal of the inputted RF signal through the waveform shaper during a transition period of burst transmission.

8. The system of claim 6 wherein the burst control circuit comprises:

an input terminal to which the envelope signal of the inputted RF signal is inputted;

an attenuator connected to the input terminal; and a waveform shaper connected to the attenuator so that a burst control signal is fed subsequent to waveform shaping thereof.

* * * * *